(12) United States Patent
Shen et al.

(10) Patent No.: US 12,413,134 B2
(45) Date of Patent: Sep. 9, 2025

(54) RECONFIGURABLE POWER CONVERSION APPARATUS AND CONTROL METHOD

(71) Applicant: Diodes Incorporated, Plano, TX (US)

(72) Inventors: Sisan Shen, Plano, TX (US); Jiansong Chen, Plano, TX (US)

(73) Assignee: Diodes Incorporated, Plano, TX (US)

( * ) Notice: Subject to any disclaimer, the term of this patent is extended or adjusted under 35 U.S.C. 154(b) by 253 days.

(21) Appl. No.: 18/203,839

(22) Filed: May 31, 2023

(65) Prior Publication Data

US 2024/0405675 A1 Dec. 5, 2024

(51) Int. Cl.
*H02M 1/088* (2006.01)
*H02M 1/00* (2006.01)
*H02M 3/158* (2006.01)

(52) U.S. Cl.
CPC ......... *H02M 1/0054* (2021.05); *H02M 1/088* (2013.01); *H02M 3/1588* (2013.01)

(58) Field of Classification Search
CPC .......................................... H02M 3/155–1588
See application file for complete search history.

(56) References Cited

U.S. PATENT DOCUMENTS

| | | | |
|---|---|---|---|
| 2004/0183510 A1 | 9/2004 | Sutardja et al. | |
| 2008/0258697 A1* | 10/2008 | Gehrke | H02M 3/1588 323/283 |
| 2010/0001704 A1 | 1/2010 | Williams | |
| 2010/0277151 A1* | 11/2010 | Tsai | H02M 3/1584 323/283 |
| 2015/0162836 A1 | 6/2015 | Rutkowski | |
| 2016/0276932 A1 | 9/2016 | Pullen et al. | |
| 2017/0222465 A1* | 8/2017 | Hawley | H02J 7/0013 |
| 2019/0245439 A1* | 8/2019 | Pehlke | H02M 3/158 |
| 2020/0321866 A1 | 10/2020 | Bogue et al. | |

OTHER PUBLICATIONS

International Search Report and Written Opinion for Application No. PCT/US2023/034199, mailed on Feb. 8, 2024, 12 pages.
Extended European Search Report for European Application No. 24178795.1, mailed Jul. 30, 2024, 10 pages.

* cited by examiner

*Primary Examiner* — Peter M Novak
(74) *Attorney, Agent, or Firm* — AP3 Law Firm PLLC; Li Li

(57) ABSTRACT

An apparatus includes a plurality of high-side switching elements connected in parallel between a first voltage bus and a switching node, wherein each high-side switching element of the plurality of high-side switching elements is controlled by a corresponding high-side driver, and a plurality of low-side switching elements connected in parallel between the switching node and a second voltage bus, wherein each low-side switching element of the plurality of low-side switching elements is controlled by a corresponding low-side driver, and wherein based on at least one operating parameter, the plurality of high-side switching elements and the plurality of low-side switching elements are controlled such that the plurality of high-side switching elements and the plurality of low-side switching elements form a reconfigurable power stage of a power converter.

13 Claims, 5 Drawing Sheets

RECONFIGURABLE POWER CONVERSION APPARATUS AND CONTROL METHOD

TECHNICAL FIELD

The present invention relates to a reconfiguration power conversion apparatus, and, in particular embodiments, to control methods for improving power conversion efficiency of the reconfiguration power conversion apparatus.

BACKGROUND

As technologies further advance, a variety of portable devices, such as mobile phones, tablet PCs, digital cameras, MP3 players and/or the like, have become popular. Each portable device may employ a plurality of rechargeable battery cells to provide power for a variety of processors such as Digital Signal Processors (DSPs), Field Programmable Gate Arrays (FPGAs), Central Processing Units (CPUs) and/or the like.

A processor (e.g., CPU) in a portable device may be powered by a power converter. The power converter may be implemented as a step-down converter (e.g., a buck converter) including two power switches connected in series. A first power switch not connected to ground is referred to as a high-side switch. A second power switch connected to ground is referred to as a low-side switch. A common node of the high-side switch and the low-side switch is a switching node of the power converter. A low-side gate drive circuit and a high-side gate drive circuit are employed to control the gates of the low-side switch and the high-side switch, respectively. The bias supply of the low-side gate drive circuit is supplied from a regulated bias voltage source. The high-side gate drive circuit may need a gate voltage higher than the voltage of the input power source connected to the power converter.

The low-side switch and the high-side switch of the power converter may be implemented as metal oxide semiconductor field effect transistors (MOSFET). MOSFETs are voltage-controlled devices. When a gate drive voltage is applied to the gate of a MOSFET, and the gate drive voltage is greater than the turn-on threshold of the MOSFET, a conductive channel is established between the drain and the source of the MOSFET. After the conductive channel has been established, the MOSFET is in an on state in which power flows between the drain and the source of the MOSFET. On the other hand, when the gate drive voltage applied to the gate is less than the turn-on threshold of the MOSFET, the MOSFET is turned off accordingly.

Power conversion efficiency is one of the most important performance indicators for switching mode power supplies (e.g., the buck converter) used in portable devices powered by batteries. For a battery-based application, it is important to achieve high efficiency across various loading conditions. The higher efficiency will result in a longer battery run time between battery charges. Furthermore, an efficient power conversion system can reduce power losses, thereby improving thermal management of the portable device.

The total power loss of a power converter includes two portions, namely, conduction losses and switching losses. The conduction losses are directly related to the on resistance of the power devices used in the power converter. The switching losses are directly related to the switching frequency of the power converter. Under a heavy load condition, the conduction losses are a dominating factor in determining the efficiency of the power converter. On the other hand, under a light load condition, the switching losses are a dominating factor in determining the efficiency of the power converter. It would be desirable to have a simple and reliable control method to reduce the switching losses and/or the conduction losses according to various different operation conditions, thereby achieving better power conversion efficiency.

SUMMARY

These and other problems are generally solved or circumvented, and technical advantages are generally achieved, by preferred embodiments of the present disclosure which provide a reconfiguration power conversion apparatus and control method for improving power conversion efficiency of the reconfiguration power conversion apparatus.

In accordance with an embodiment, an apparatus comprises a plurality of high-side switching elements connected in parallel between a first voltage bus and a switching node, wherein each high-side switching element of the plurality of high-side switching elements is controlled by a corresponding high-side driver, and a plurality of low-side switching elements connected in parallel between the switching node and a second voltage bus, wherein each low-side switching element of the plurality of low-side switching elements is controlled by a corresponding low-side driver, and wherein based on at least one operating parameter, the plurality of high-side switching elements and the plurality of low-side switching elements are controlled such that the plurality of high-side switching elements and the plurality of low-side switching elements form a reconfigurable power stage of a power converter.

In accordance with another embodiment, a method comprises detecting a plurality of operating parameters of a power converter comprising a plurality of high-side switching elements connected in parallel between a first voltage bus and a switching node, and a plurality of low-side switching elements connected in parallel between the switching node and a second voltage bus, and based on at least one operating parameter, dynamically reconfiguring the plurality of high-side switching elements and the plurality of low-side switching elements to achieve an improved operating parameter.

In accordance with yet another embodiment, a system comprises a plurality of high-side switching elements connected in parallel between a first voltage bus and a switching node, a plurality of high-side drivers, each of which is connected to a corresponding high-side switching element, a plurality of low-side switching elements connected in parallel between the switching node and a second voltage bus, a plurality of low-side drivers, each of which is connected to a corresponding low-side switching element, an inductor connected between the switching node and an output of the system, and a capacitor connected between the output of the system and the second voltage bus.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a reconfiguration power conversion apparatus and control method for improving power conversion efficiency of a power converter. The disclosure may also be applied, however, to a variety of power conversion systems. Hereinafter, various embodiments will be explained in detail with reference to the accompanying drawings.

Figure 1:
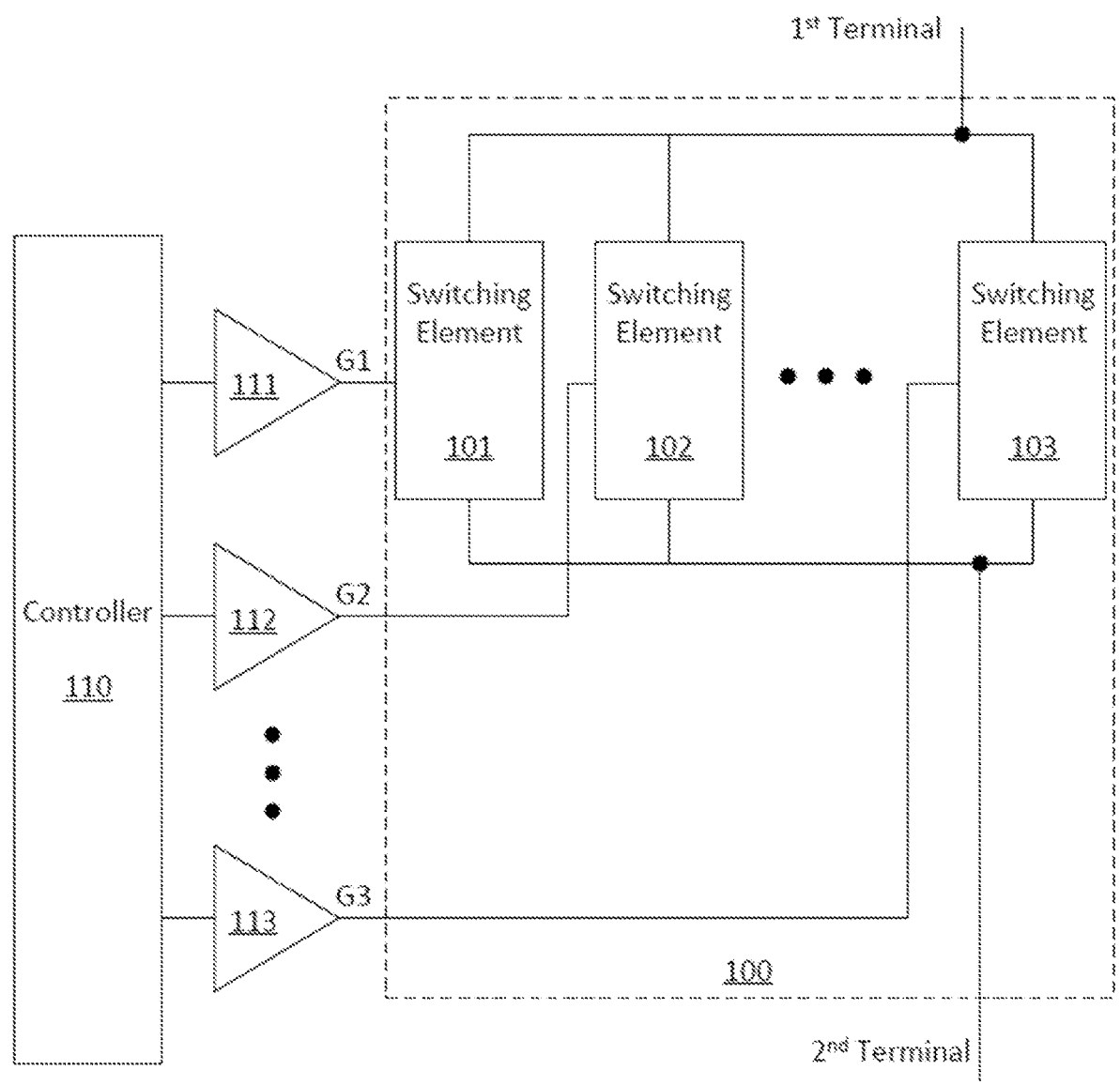
FIG. 1 illustrates a block diagram of a reconfigurable power device in accordance with various embodiments of the present disclosure.

FIG. 1 illustrates a block diagram of a reconfigurable power device in accordance with various embodiments of the present disclosure. The reconfigurable power device 100 comprises a plurality of switching elements including a first switching element 101, a second switching element 102 and a third switching element 103. As shown in FIG. 1, the plurality of switching elements is connected in parallel. The reconfigurable power device 100 shown in FIG. 1 may be used to form a reconfigurable power conversion apparatus. The detailed structure and operating principles of the reconfigurable power conversion apparatus will be described below with respect to FIG. 3.

It should be noted that FIG. 1 illustrates only three switching elements of the reconfigurable power device that may include hundreds of such switching elements. The number of switching elements illustrated herein is limited solely for the purpose of clearly illustrating the inventive aspects of the various embodiments. The present disclosure is not limited to any specific number of switching elements.

In some embodiments, the plurality of switching elements including the first switching element 101, the second switching element 102 and the third switching element 101 is integrated in a semiconductor package having a first terminal, a second terminal and a plurality of gate terminals including a first gate terminal G1, a second gate terminal G2 and a third gate terminal G3 as shown in FIG. 1.

In some embodiments, each switching element (e.g., first switching element 101) comprises one transistor cell. The gate of the transistor cell is configured to be connected to an output of a corresponding gate drive circuit (e.g., a first gate drive circuit 111). In alternative embodiments, each switching element (e.g., first switching element 101) comprises a first number of transistor cells connected in parallel between the first terminal and the second terminal of the reconfigurable power device 100. The gates of the first number of transistor cells are connected together. As shown in FIG. 1, the gates of the first number of transistor cells of the first switching element 101 are configured to be connected to an output of a first gate drive circuit 111.

In some embodiments, the first terminal shown in FIG. 1 is a drain terminal of the reconfigurable power device 100. The second terminal shown in FIG. 1 is a source terminal of the reconfigurable power device 100. The drain terminal is connected to drains of the transistor cells of the plurality of switching elements. The source terminal is connected to sources of the transistor cells of the plurality of switching elements.

The controller 110 is configured to generate gate drive signals for the plurality of switching elements. In some embodiments, the controller 110 is configured to control the operation of the plurality of switching elements based on a plurality of operating parameters (e.g., sensed current, temperature and the like). In particular, the controller 110 is configured to generate gate drive signals for configuring the plurality of switching elements such that based on a current flowing through the reconfigurable power device 100, at least one switching element of the plurality of switching elements is configured to operate in a constant off mode to reduce the switching losses of the reconfigurable power device 100.

In some embodiments, the controller 110 is configured to control the operation of the plurality of switching elements based on a plurality of operating parameters. In particular, the controller 110 is configured to generate gate drive signals for configuring the plurality of switching elements such that at least one switching element of the plurality of switching elements is configured to dynamically leave a PWM mode and enter into a constant off mode to achieve better efficiency.

In some embodiments, the controller 110 is configured to control the operation of the plurality of switching elements based on a plurality of operating parameters. In particular, the controller 110 is configured to generate gate drive signals for configuring the plurality of switching elements such that based on the current flowing through the reconfigurable power device 100, a switching frequency of the plurality of switching elements is adjusted to reduce the switching losses of the reconfigurable power device 100.

In some embodiments, the controller 110 is configured to control the operation of the plurality of switching elements based on a plurality of operating parameters. In particular, the controller 110 is configured to generate gate drive signals for configuring the plurality of switching elements such that the gate drive voltage of at least one switching element of the plurality of switching elements is configured to be dynamically adjusted to achieve better efficiency.

In some embodiments, the controller 110 is configured to generate gate drive signals for configuring the plurality of switching elements such that three different control methods are performed in an alternating manner to achieve better efficiency. In a first control method, at least one switching element of the plurality of switching elements is configured to leave the PWM mode and enter into the constant off mode to reduce switching losses. In a second control method, a switching frequency of the at least one switching element is adjusted to reduce the switching losses. In a third control method, a gate drive voltage of the at least one switching element is adjusted to further reduce the switching losses.

Figure 2:
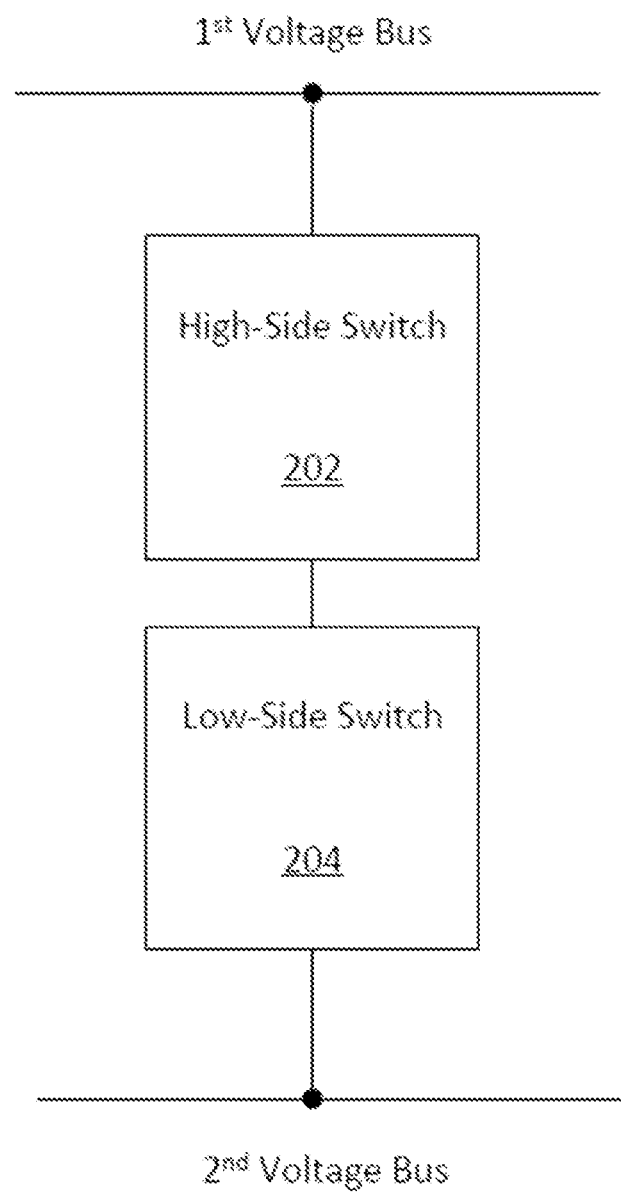
FIG. 2 illustrates a block diagram of a reconfigurable power conversion system comprising a high-side switch and a low-side switch connected in series in accordance with various embodiments of the present disclosure.

FIG. 2 illustrates a block diagram of a reconfigurable power conversion system comprising a high-side switch and a low-side switch connected in series in accordance with various embodiments of the present disclosure. As shown in FIG. 2, a high-side switch 202 and a low-side switch 204 are connected in series between a first voltage bus and a second voltage bus. In some embodiments, the high-side switch 202 and a low-side switch 204 may be part of a step-down power converter (e.g., a buck power converter). In alternative embodiments, the high-side switch 202 and the low-side switch 204 may be part of other suitable power conversion systems such as a full-bridge power converter, a half-bridge power converter, an LLC resonant converter, a motor driver and the like.

In some embodiments, the highs-side switch 202 is formed by the reconfigurable power device 100 shown in FIG. 1. In particular, the high-side switch 202 comprises a plurality of switching elements connected in parallel. Each switching element of the plurality of switching elements is independently controlled by a dedicated driver. The detailed structure of the high-side switch 202 will be described below with respect to FIG. 3.

In some embodiments, the low-side switch 204 is formed by the reconfigurable power device 100 shown in FIG. 1. In particular, the low-side switch 204 comprises a plurality of switching elements connected in parallel. Each switching element of the plurality of switching elements is independently controlled by a dedicated driver. The detailed structure of the low-side switch 204 will be described below with respect to FIG. 3.

Figure 3:
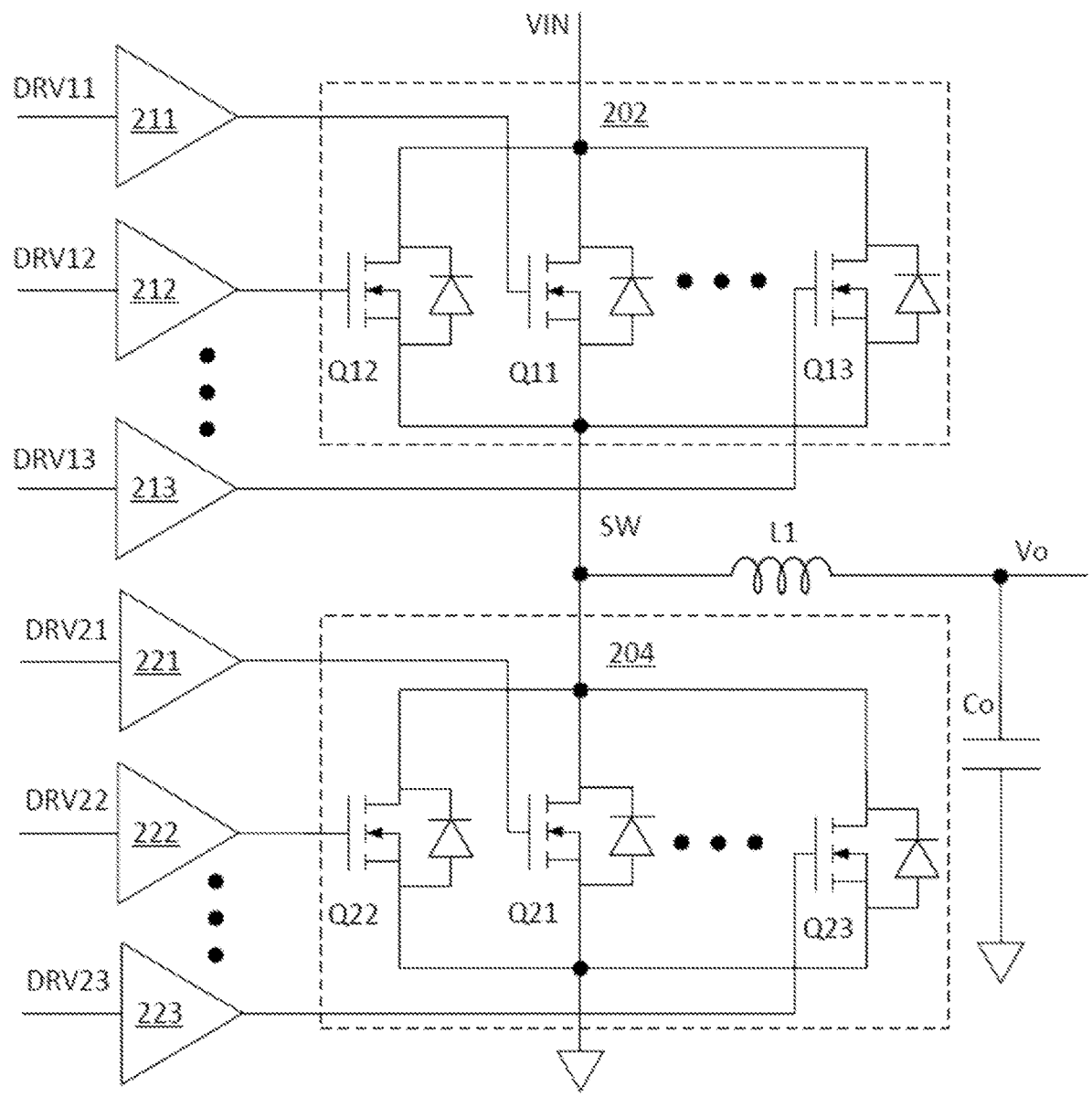
FIG. 3 illustrates a schematic diagram of a step-down converter formed by the reconfigurable power device shown in FIG. 1 in accordance with various embodiments of the present disclosure.

FIG. 3 illustrates a schematic diagram of a step-down converter formed by the reconfigurable power device shown in FIG. 1 in accordance with various embodiments of the present disclosure. The step-down converter comprises a high-side switch 202 and a low-side switch 204 connected in series between the input voltage bus VIN and ground. The input voltage bus VIN is coupled to an input power source. The step-down converter further comprises an inductor L1 connected between a common node of the high-side switch 202 and the low-side switch 204, and an output bus Vo of the step-down converter. The common node of the high-side switch 202 and the low-side switch 204 is also known as a switching node (SW) of the step-down converter.

In some embodiments, the high-side switch 202 is implemented as the reconfigurable power device 100 shown in FIG. 1. As shown in FIG. 3, the high-side switch 202 comprises a plurality of high-side switching elements including a first high-side switching element Q11, a second high-side switching element Q12 and a third high-side switching element Q13 connected in parallel between VIN and the switching node SW.

In some embodiments, the low-side switch 204 is implemented as the reconfigurable power device 100 shown in FIG. 1. As shown in FIG. 3, the low-side switch 204 comprises a plurality of low-side switching elements including a first low-side switching element Q21, a second low-side switching element Q22 and a third low-side switching element Q23 connected in parallel between the switching node SW and ground.

Throughout the description, the step-down converter shown in FIG. 3 may be alternatively referred to as a reconfigurable power conversion apparatus.

In accordance with an embodiment, the switching elements of FIG. 3 (e.g., switches Q11, Q12, Q13, Q21, Q22 and Q23) may be metal oxide semiconductor field-effect transistor (MOSFET) devices. Alternatively, the switching elements can be any controllable switches such as insulated gate bipolar transistor (IGBT) devices, integrated gate commutated thyristor (IGCT) devices, gate turn-off thyristor (GTO) devices, silicon-controlled rectifier (SCR) devices, junction gate field-effect transistor (JFET) devices, MOS controlled thyristor (MCT) devices, gallium nitride (GaN) based power devices, silicon carbide (SiC) based power devices and the like.

It should be noted while FIG. 3 shows the switches Q11, Q12, Q13, Q21, Q22 and Q23 are implemented as single n-type transistors, a person skilled in the art would recognize there may be many variations, modifications and alternatives. For example, depending on different applications and design needs, at least some of the switches (e.g., Q11, Q12 and Q13) may be implemented as p-type transistors. Furthermore, each switch shown in FIG. 3 may be implemented as a plurality of switches connected in parallel. Moreover, a capacitor may be connected in parallel with one switch to achieve zero voltage switching (ZVS)/zero current switching (ZCS)

A controller (not shown) is configured to generate gate drive signals DRV11, DRV12, DRV13 for the high-side switch 202, and gate drive signals DRV21, DRV22, DRV23 for the low-side switch 204. As shown in FIG. 3, a first high-side driver 211 is configured to receive the first high-side drive signal DRV11 and provide DRV11 for the first high-side switching element Q11. A second high-side driver 212 is configured to receive the second high-side drive signal DRV12 and provide DRV12 for the second high-side switching element Q12. A third high-side driver 213 is configured to receive the third high-side drive signal DRV13 and provide DRV13 for the third high-side switching element Q13. As shown in FIG. 3, each switching element (e.g., Q11) of the plurality of high-side switching elements is independently controlled by a dedicated driver (e.g., driver 211).

A first low-side driver 221 is configured to receive the first low-side drive signal DRV21 and provide DRV21 for the first low-side switching element Q21. A second low-side driver 222 is configured to receive the second low-side drive signal DRV22 and provide DRV22 for the second low-side switching element Q22. A third low-side driver 223 is configured to receive the third low-side drive signal DRV23 and provide DRV23 for the third low-side switching element Q23. As shown in FIG. 3, each switching element (e.g., Q21) of the plurality of low-side switching elements is independently controlled by a dedicated driver (e.g., driver 221).

The efficiency of the step-down converter shown in FIG. 3 can be improved through reconfiguring the plurality of high-side switching elements and the plurality of low-side switching elements to form a reconfigurable power stage suitable for a particular operating condition. For example, under a light load condition, the switching losses is dominating factor in determining the efficiency. In order to reduce the switching losses, some switching elements of the high-side switch 202 and/or some switching elements of the low-side switch 204 are configured to leave the PWM mode and enter into the constant off mode, thereby reducing the switching losses.

In operation, a current flowing through the inductor L1 is detected by a suitable current sensor. The detected current is fed into the controller. Based on the current flowing through the inductor, the controller is configured to generate drive signals (e.g., DRV11, DRV12, DRV13, DRV21, DRV22 and DRV23). The drive signals are configured such that at least one switching element of the plurality of high-side switching elements and the plurality of low-side switching elements is configured to leave a PWM mode and enter into a constant off mode to reduce switching losses of the step-down converter. For example, in a light load operating condition, only one high-side switching element (e.g., Q11) and one low-side switching element (e.g., Q21) are configured to operate in the PWM mode. The rest switching elements are in the constant off mode. The constant off mode helps to reduce the switching losses, thereby improving the efficiency of the step-down converter.

In operation, a current flowing through the inductor L1 is detected by a suitable current sensor. The detected current is fed into the controller. Based on the current flowing through the inductor, the controller is configured to generate drive signals (e.g., DRV11, DRV12, DRV13, DRV21, DRV22 and DRV23). The drive signals are configured such that the switching frequency of the plurality of high-side switching elements and the plurality of low-side switching elements is adjusted to reduce switching losses of the step-down converter. For example, in a light load operating condition, the switching frequency may be reduced. The reduced switching frequency helps to reduce the switching losses, thereby improving the efficiency of the step-down converter.

In operation, an input current, an input voltage, an output voltage and a current flowing through an inductor of the step-down converter are detected by suitable voltage and current sensors. An efficiency value of the step-down converter is calculated based on the input current, the input voltage, the output voltage and the current flowing through the inductor. In a trial-and-error process, at least one switching element of the plurality of high-side switching elements and the plurality of low-side switching elements are dynamically configured to leave a PWM mode and enter into a constant off mode to achieve a better efficiency value.

In operation, a hot spot temperature of the step-down converter is detected by a suitable temperature sensor. In a trial-and-error process, at least one switching element of the plurality of high-side switching elements and the plurality of low-side switching elements is dynamically configured to leave a PWM mode and enter into a constant off mode to reduce the hot spot temperature.

In operation, an input current, an input voltage, an output voltage and a current flowing through an inductor of the step-down converter are detected by suitable voltage and current sensors. An efficiency value of the step-down converter is calculated based on the input current, the input voltage, the output voltage and the current flowing through the inductor. In a trial-and-error process, a switching frequency of the step-down converter is dynamically adjusted to achieve a better efficiency value.

In operation, an input current, an input voltage, an output voltage and a current flowing through an inductor of the step-down converter are detected by suitable voltage and current sensors. An efficiency value of the step-down converter is calculated based on the input current, the input voltage, the output voltage and the current flowing through the inductor. In a trial-and-error process, a gate drive voltage of the plurality of high-side switching elements and a gate drive voltage of the plurality of low-side switching elements are dynamically adjusted to achieve a better efficiency value.

In operation, a duty cycle of the step-down converter is detected/calculated by a suitable processing device. In response to a reduced duty cycle, at least one switching element of the plurality of high-side switching elements is configured to leave a PWM mode and enter into a constant off mode to reduce the switching losses of the step-down converter. In response to an increased duty cycle, at least one switching element of the plurality of low-side switching elements is configured to leave a PWM mode and enter into a constant off mode to reduce the switching losses of the power converter.

In operation, an input current, an input voltage, an output voltage and a current flowing through an inductor of the step-down converter are detected by suitable voltage and current sensors. An efficiency value of the step-down converter is calculated based on the input current, the input voltage, the output voltage and the current flowing through the inductor. In a trial-and-error process, three control methods are performed in a sequential manner to achieve a better efficiency value. In a first control method. the plurality of high-side switching elements and the plurality of low-side switching elements are configured to operate in different operating mode. For example, one switching element is configured to leave a PWM mode and enter into a constant off mode. In a second control method, a switching frequency of the step-down converter is adjusted. In a third control method, a gate drive voltage of the plurality of high-side switching elements and a gate drive voltage of the plurality of low-side switching elements are adjusted.

Figure 4:
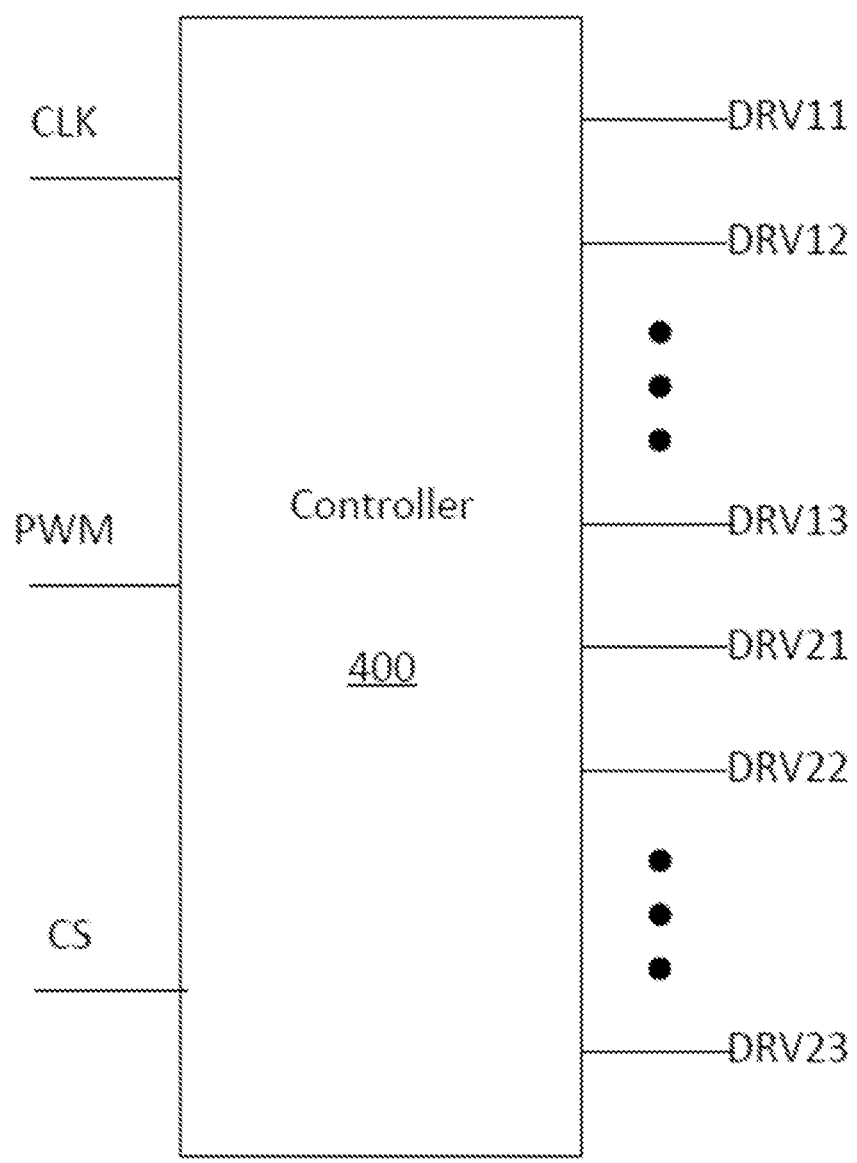
FIG. 4 illustrates a controller for driving the switches of the step-down converter shown in FIG. 3 in accordance with various embodiments of the present disclosure.

FIG. 4 illustrates a controller for driving the switches of the step-down converter shown in FIG. 3 in accordance with various embodiments of the present disclosure. The controller 400 comprises a plurality of gate drivers and a plurality of signal processing devices for processing various operating parameters. The plurality of gate drivers includes both high-side gate drives and low-side gate drivers.

As shown in FIG. 4, the controller 400 is configured to receive a plurality of signals including a clock (CLK) signal, a PWM signal and a current sense (CS) signal. Based on the received signals, the controller 400 is able to generate a plurality of gate drive signals including DRV11, DRV12, DRV13, DRV21, DRV22 and DRV23.

A first high-side gate driver is configured to generate a first high-side gate drive signal DRV11 applied to the gate of Q11. A second high-side gate driver is configured to generate a second high-side gate drive signal DRV12 applied to the gate of Q12. A third high-side gate driver is configured to generate a third high-side gate drive signal DRV13 applied to the gate of Q13.

A first low-side gate driver is configured to generate a first low-side gate drive signal DRV21 applied to the gate of Q21. A second low-side gate driver is configured to generate a second low-side gate drive signal DRV22 applied to the gate of Q22. A third low-side gate driver is configured to generate a third low-side gate drive signal DRV23 applied to the gate of Q23.

It should be noted that the controller 400 having six gate drivers described above is merely an example, which should not unduly limit the scope of the claims. One of ordinary skill in the art would recognize many variations, alternatives, and modifications. For example, depending on different applications and design needs, the controller 400 have additional gate drivers. In addition, external gate drivers may be used to further improve the drive capability.

Figure 5:
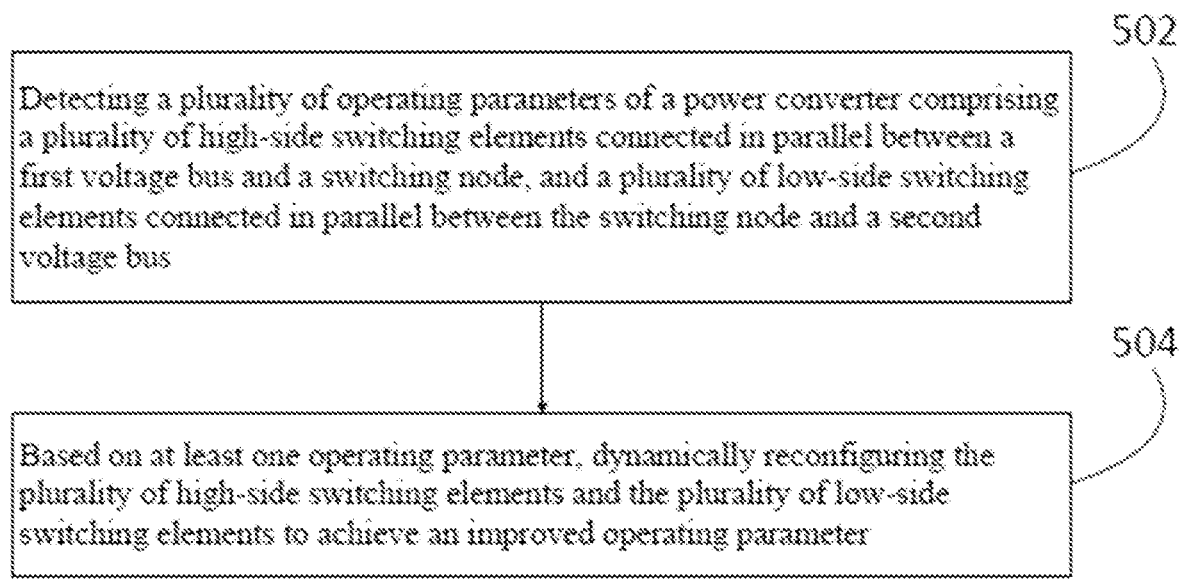
FIG. 5 illustrates a flow chart of controlling the step-down converter shown in FIG. 3 in accordance with various embodiments of the present disclosure.

FIG. 5 illustrates a flow chart of controlling the step-down converter shown in FIG. 3 in accordance with various embodiments of the present disclosure. This flowchart shown in FIG. 5 is merely an example, which should not unduly limit the scope of the claims. One of ordinary skill in the art would recognize many variations, alternatives, and modifications. For example, various steps illustrated in FIG. 5 may be added, removed, replaced, rearranged and repeated.

Referring back to FIG. 3, the step-down converter comprises a high-side switch 202 and a low-side switch 204 connected in series between the input voltage bus VIN and ground. The high-side switch 202 comprises a plurality of high-side switching elements connected in parallel between the input voltage bus VIN and the switching node SW. A plurality of high-side drivers is employed to drive the plurality of high-side switching elements. In particular, each high-side driver is connected to a corresponding high-side switching element. The low-side switch 204 comprises a plurality of low-side switching elements connected in parallel between the switching node SW and ground. A plurality of low-side drivers is employed to drive the plurality of low-side switching elements. In particular, each low-side driver is connected to a corresponding low-side switching element. An inductor L1 is connected between the switching node SW and an output of the step-down converter. A capacitor Co is connected between the output of the step-down converter and ground.

At step 502, a plurality of operating parameters of a power converter is detected. The power converter comprises a plurality of high-side switching elements connected in parallel between a first voltage bus and a switching node, and a plurality of low-side switching elements connected in parallel between the switching node and a second voltage bus.

At step 504, based on at least one operating parameter, the plurality of high-side switching elements and the plurality of low-side switching elements are dynamically reconfigured to achieve an improved operating parameter.

The method further comprises detecting a current flowing through an inductor of the power converter, and based on the current flowing through the inductor, configuring at least one switching element of the plurality of high-side switching elements and the plurality of low-side switching elements to leave a PWM mode and enter into a constant off mode to reduce switching losses of the power converter.

The method further comprises detecting a current flowing through an inductor of the power converter, and based on the current flowing through the inductor, adjusting a switching frequency of the power converter to reduce switching losses of the power converter.

The method further comprises detecting an input current, an input voltage, an output voltage and a current flowing through an inductor of the power converter, calculating an efficiency value of the power converter based on the input current, the input voltage, the output voltage and the current flowing through the inductor, and in a trial-and-error process, dynamically configuring at least one switching element of the plurality of high-side switching elements and the plurality of low-side switching elements to leave a PWM mode and enter into a constant off mode to achieve a better efficiency value.

The method further comprises detecting a hot spot temperature of the power converter, and in a trial-and-error process, dynamically configuring at least one switching element of the plurality of high-side switching elements and the plurality of low-side switching elements to leave a PWM mode and enter into a constant off mode to reduce the hot spot temperature.

The method further comprises detecting an input current, an input voltage, an output voltage and a current flowing through an inductor of the power converter, calculating an efficiency value of the power converter based on the input current, the input voltage, the output voltage and the current flowing through the inductor, and in a trial-and-error process, dynamically adjusting a switching frequency of the power converter to achieve a better efficiency value.

The method further comprises detecting an input current, an input voltage, an output voltage and a current flowing through an inductor of the power converter, calculating an efficiency value of the power converter based on the input current, the input voltage, the output voltage and the current flowing through the inductor, and in a trial-and-error process, dynamically adjusting a gate drive voltage of the plurality of high-side switching elements and a gate drive voltage of the plurality of low-side switching elements to achieve a better efficiency value.

The method further comprises detecting a duty cycle of the power converter, in response to a reduced duty cycle, configuring at least one switching element of the plurality of high-side switching elements to leave a PWM mode and enter into a constant off mode to reduce switching losses of the power converter, and in response to an increased duty cycle, configuring at least one switching element of the plurality of low-side switching elements to leave the PWM mode and enter into the constant off mode to reduce the switching losses of the power converter.

The method further comprises detecting an input current, an input voltage, an output voltage and a current flowing through an inductor of the power converter, calculating an efficiency value of the power converter based on the input current, the input voltage, the output voltage and the current flowing through the inductor, and in a trial-and-error process, reconfiguring operating modes of the plurality of high-side switching elements and the plurality of low-side switching elements, adjusting a switching frequency of the power converter, and adjusting a gate drive voltage of the plurality of high-side switching elements and a gate drive voltage of the plurality of low-side switching elements are performed in a sequential manner to achieve a better efficiency value.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a plurality of high-side switching elements connected in parallel between a first voltage bus and a switching node, wherein each high-side switching element of the plurality of high-side switching elements is controlled by a corresponding high-side driver; and
a plurality of low-side switching elements connected in parallel between the switching node and a second voltage bus, wherein each low-side switching element of the plurality of low-side switching elements is controlled by a corresponding low-side driver, and wherein based on at least one operating parameter, the plurality of high-side switching elements and the plurality of low-side switching elements are controlled such that the plurality of high-side switching elements and the plurality of low-side switching elements form a reconfigurable power stage of a power converter, and wherein at least one switching element of the plurality of high-side switching elements and the plurality of low-side switching elements is configured to dynamically enter into a constant off mode from a PWM mode to achieve better efficiency, and wherein as a result of configuring the at least one switching element to dynamically enter into the constant off mode, the plurality of high-side switching elements and the plurality of low-side switching elements form the reconfigurable power stage of the power converter, and wherein configuring the at least one switching element to dynamically enter into the constant off mode, adjusting a switching frequency of the at least one switching element and adjusting a turn-on gate voltage of the at least one switching element between a threshold voltage and a fully turn-on voltage are performed in an alternating manner to achieve better efficiency.

2. The apparatus of claim 1, wherein:
the first voltage bus is coupled to an input power source;
the second voltage bus is coupled to ground;
each switching element of the plurality of high-side switching elements comprises at least one high-side transistor cell; and
each switching element of the plurality of low-side switching elements comprises at least one low-side transistor cell.

3. The apparatus of claim 1, further comprising:
an inductor connected between the switching node and an output of the power converter; and
a capacitor connected between the output of the power converter and the second voltage bus.

4. The apparatus of claim 1, wherein:
based on a reduced duty cycle of the power converter, at least one switching element of the plurality of high-side switching elements is configured to operate in a constant off mode to reduce switching losses of the power converter; and
based on an increased duty cycle of the power converter, at least one switching element of the plurality of low-side switching elements is configured to operate in the constant off mode to reduce the switching losses of the power converter.

5. A method comprising:
detecting a plurality of operating parameters of a power converter comprising:

a plurality of high-side switching elements connected in parallel between a first voltage bus and a switching node; and
a plurality of low-side switching elements connected in parallel between the switching node and a second voltage bus; and
based on at least one operating parameter, dynamically reconfiguring the plurality of high-side switching elements and the plurality of low-side switching elements to achieve an improved operating parameter, wherein the step of dynamically reconfiguring the plurality of high-side switching elements and the plurality of low-side switching elements to achieve the improved operating parameter comprises reconfiguring operating modes of the plurality of high-side switching elements and the plurality of low-side switching elements, adjusting a switching frequency of the power converter, and adjusting a turn-on gate drive voltage of the plurality of high-side switching elements and a turn-on gate drive voltage of the plurality of low-side switching elements, and wherein reconfiguring the operating modes of the plurality of high-side switching elements and the plurality of low-side switching elements, adjusting the switching frequency of the power converter, and adjusting the turn-on gate drive voltage of the plurality of high-side switching elements and the turn-on gate drive voltage of the plurality of low-side switching elements are performed in a sequential manner to achieve a better efficiency value.

6. The method of claim 5, wherein:
reconfiguring operating modes of the plurality of high-side switching elements and the plurality of low-side switching elements comprises configuring at least one switching element of the plurality of high-side switching elements and the plurality of low-side switching elements to leave a PWM mode and enter into a constant off mode to reduce switching losses of the power converter.

7. The method of claim 5, wherein:
reconfiguring operating modes of the plurality of high-side switching elements and the plurality of low-side switching elements comprises dynamically configuring at least one switching element of the plurality of high-side switching elements and the plurality of low-side switching elements to leave a PWM mode and enter into a constant off mode to achieve a better efficiency value.

8. The method of claim 5, wherein:
reconfiguring operating modes of the plurality of high-side switching elements and the plurality of low-side switching elements comprises dynamically configuring at least one switching element of the plurality of high-side switching elements and the plurality of low-side switching elements to leave a PWM mode and enter into a constant off mode to reduce a hot spot temperature.

9. The method of claim 5, further comprising:
in response to a reduced duty cycle, configuring at least one switching element of the plurality of high-side switching elements to leave a PWM mode and enter into a constant off mode to reduce switching losses of the power converter; and
in response to an increased duty cycle, configuring at least one switching element of the plurality of low-side switching elements to leave the PWM mode and enter into the constant off mode to reduce the switching losses of the power converter.

10. A system comprising:
a plurality of high-side switching elements connected in parallel between a first voltage bus and a switching node;
a plurality of high-side drivers, each of which is connected to a corresponding high-side switching element;
a plurality of low-side switching elements connected in parallel between the switching node and a second voltage bus;
a plurality of low-side drivers, each of which is connected to a corresponding low-side switching element;
an inductor connected between the switching node and an output of the system; and
a capacitor connected between the output of the system and the second voltage bus, wherein a better efficiency value is achieved through reconfiguring operating modes of the plurality of high-side switching elements and the plurality of low-side switching elements, adjusting a switching frequency of the system, and adjusting a turn-on gate drive voltage of the plurality of high-side switching elements and a turn-on gate drive voltage of the plurality of low-side switching elements, and wherein reconfiguring the operating modes of the plurality of high-side switching elements and the plurality of low-side switching elements, adjusting the switching frequency of the system, and adjusting the turn-on gate drive voltage of the plurality of high-side switching elements and the turn-on gate drive voltage of the plurality of low-side switching elements are performed in a sequential manner.

11. The system of claim 10, wherein:
the first voltage bus is coupled to an input power source;
the second voltage bus is coupled to ground;
each switching element of the plurality of high-side switching elements comprises at least one high-side transistor cell; and
each switching element of the plurality of low-side switching elements comprises at least one low-side transistor cell.

12. The system of claim 10, further comprising:
a controller configured to provide gate drive signals for the plurality of high-side drivers and the plurality of high-side drivers, wherein the controller is configured to:
based on a current flowing through the inductor, configure at least one switching element of the plurality of high-side switching elements and the plurality of low-side switching elements.

13. The system of claim 10, further comprising:
a controller configured to provide gate drive signals for the plurality of high-side drivers and the plurality of high-side drivers, wherein the controller is configured to:
in a trial-and-error process, dynamically configure at least one switching element of the plurality of high-side switching elements and the plurality of low-side switching elements.

\* \* \* \* \*